(12) United States Patent
Watanabe et al.

(10) Patent No.: US 8,455,369 B2
(45) Date of Patent: Jun. 4, 2013

(54) TRENCH EMBEDDING METHOD

(75) Inventors: Masahisa Watanabe, Nirasaki (JP);
Mitsuhiro Okada, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/334,352

(22) Filed: Dec. 22, 2011

(65) Prior Publication Data

US 2012/0164842 A1 Jun. 28, 2012

(30) Foreign Application Priority Data

Dec. 27, 2010 (JP) ................................. 2010-290647

(51) Int. Cl.
*H01L 21/31* (2006.01)

(52) U.S. Cl.
USPC ............................. 438/763; 438/761; 438/762

(58) Field of Classification Search
USPC .......................................................... 438/479
See application file for complete search history.

(56) References Cited

U.S. PATENT DOCUMENTS

| 7,112,513 | B2 | 9/2006 | Smythe et al. | |
|---|---|---|---|---|
| 2003/0068855 | A1* | 4/2003 | Moore | 438/216 |
| 2005/0085054 | A1* | 4/2005 | Chakravarti et al. | 438/478 |
| 2005/0186755 | A1* | 8/2005 | Smythe et al. | 438/424 |
| 2009/0029532 | A1* | 1/2009 | Huang et al. | 438/479 |
| 2010/0311251 | A1* | 12/2010 | Okada et al. | 438/761 |
| 2010/0314672 | A1* | 12/2010 | Manda | 257/292 |
| 2011/0275197 | A1* | 11/2011 | Park et al. | 438/478 |

\* cited by examiner

*Primary Examiner* — Charles Garber
*Assistant Examiner* — Brigitte Paterson
(74) *Attorney, Agent, or Firm* — Cantor Colburn LLP

(57) ABSTRACT

A trench embedding method includes forming an oxidization barrier film on a trench; forming an expandable film on the oxidization barrier film; embedding an embedding material that contracts by being fired on the trench; and firing the embedding material, wherein the forming of the oxidization barrier film includes: forming a first seed layer on the trench by supplying an aminosilane-based gas; and forming a silicon nitride film on the first seed layer, wherein the forming of the expandable film includes: forming a second seed layer on the silicon nitride film by supplying an aminosilane-based gas; and forming a silicon film on the second seed layer.

10 Claims, 9 Drawing Sheets

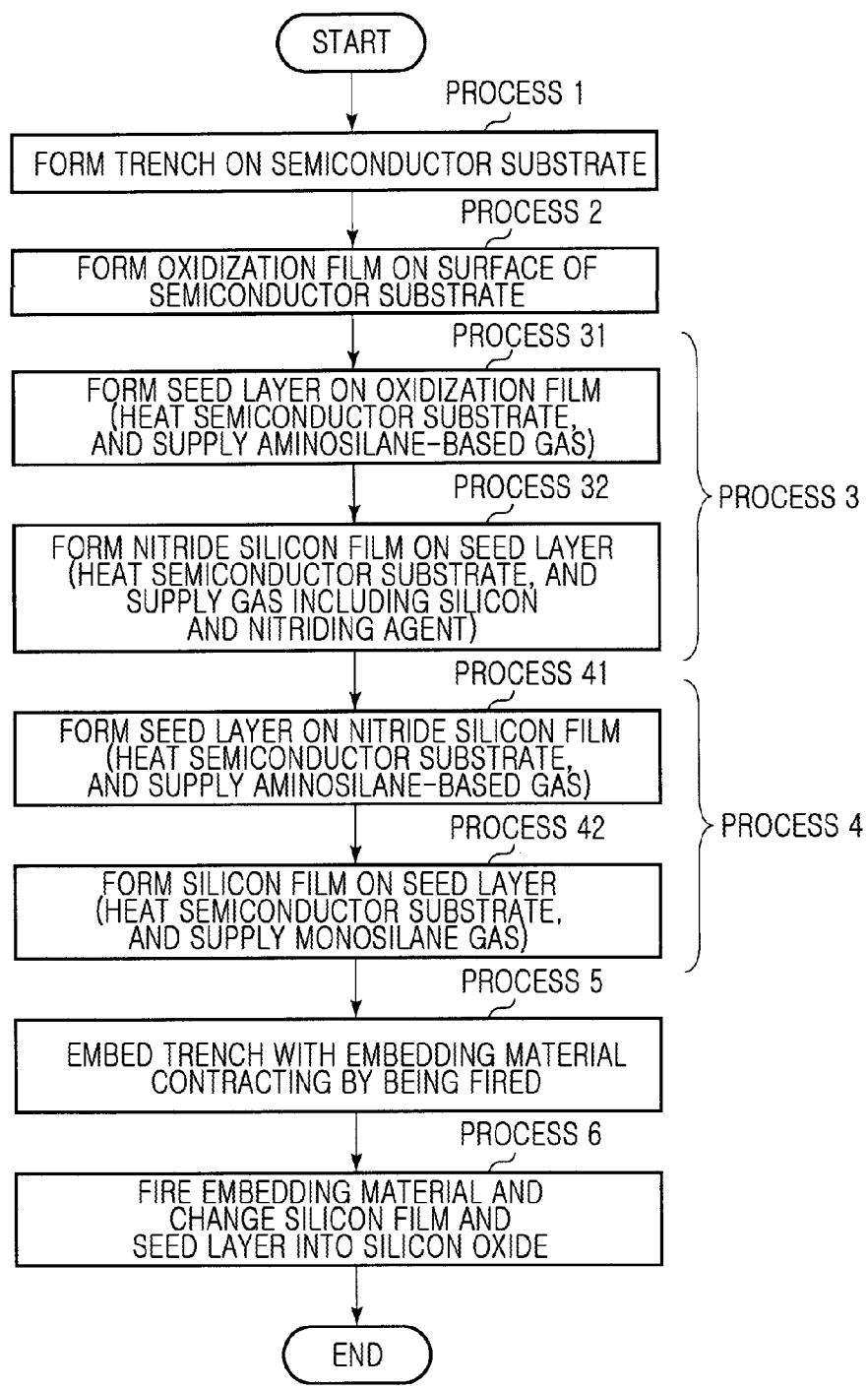

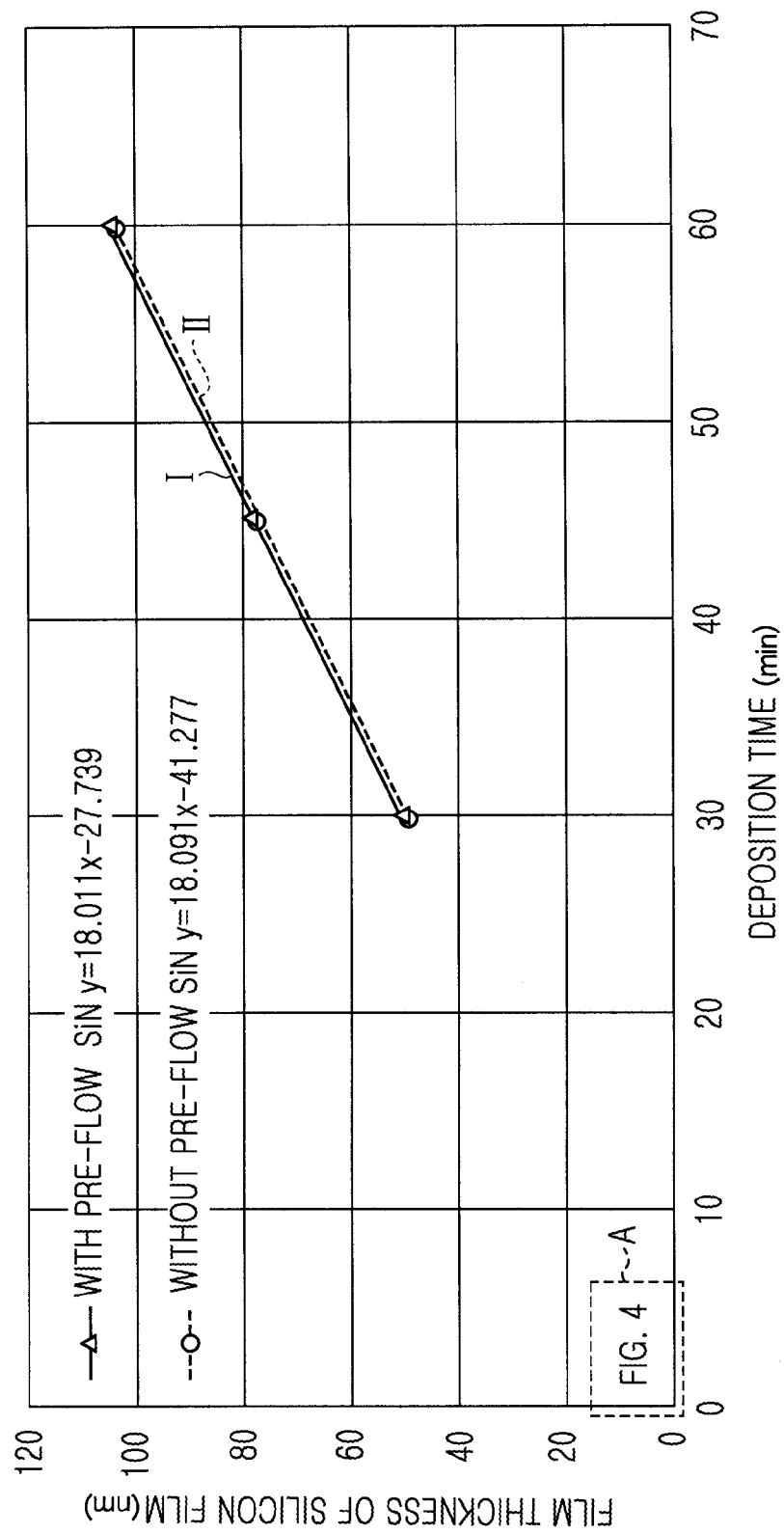

TRENCH EMBEDDING METHOD

CROSS-REFERENCE TO RELATED PATENT APPLICATIONS

This application claims the benefit of Japanese Patent Application No. 2010-290647, filed on Dec. 27, 2010 in the Japan Patent Office, the disclosure of which is incorporated herein in its entirety by reference.

BACKGROUND OF THE INVENTION

1. Field of the Invention

The present invention relates to a trench embedding method and a film-forming apparatus.

2. Description of the Related Art

Semiconductor integrated circuit devices have a minute trench structure therein. A typical example of the minute trench structure is a STI (shallow trench isolation). An STI is a device isolation area for dividing active areas of a semiconductor device, and is formed by forming a minute trench on a silicon substrate and embedding an insulating material into the minute trench.

For example, an SOD (spin-on dielectric), as disclosed in Patent Reference 1, is known as an embedded insulating material. In particular, an inorganic polymer mainly including PHPS (perhydropolysilazane: $SiH_2NH$) has attracted attention. When PHPS is fired in a vapor atmosphere, PHPS is changed into silicon oxide ($SiO_2$). A reaction formula thereof is as follows.

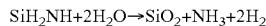

$$SiH_2NH + 2H_2O \rightarrow SiO_2 + NH_3 + 2H_2$$

However, PHPS contracts when changed into silicon oxide. Thus, a gap is generated on a minute trench on which PHPS is changed into silicon oxide.

Accordingly, in Patent Reference 1, an expandable film is formed on a minute trench and then PHPS is embedded into the minute trench in prediction of contraction of PHPS. Such an expandable film may be a silicon (Si) film. In Patent Reference 1, a silicon film is expanded by being changed into a silicon oxide film, and thus contraction of PHPS is offset, thereby preventing a gap from being generated on a minute trench.

3. Prior Art Reference (Patent Reference 1) U.S. Pat. No. 7,112,513

SUMMARY OF THE INVENTION

In Patent Reference 1, a process of changing a silicon film into a silicon oxide film, that is, an oxidization process, is disclosed. For this, before a silicon film is formed, a film serving as an oxidation barrier through which oxygen may hardly pass is formed on a minute trench so that a silicon substrate may not be oxidized due to oxidization reaching the silicon substrate. In Patent Reference 1, a film serving as an oxidization barrier is a silicon nitride film ($Si_3N_4$).

However, if a trench is further miniaturized, it may be difficult or impossible to form a film serving as an oxidization barrier on the trench, in addition to an expandable film.

The present invention is made in view of the above-described problems, and provides a trench embedding method that allows an expandable film and a film serving as an oxidization barrier to be formed on a trench even if the trench is further miniaturized, and a film-forming apparatus capable of performing the trench embedding method.

According to an aspect of the present invention, a trench embedding method includes: forming an oxidization barrier film on a trench formed on a semiconductor substrate; forming an expandable film on the oxidization barrier film; embedding an embedding material that contracts by being fired on the trench where the oxidization barrier film and the expandable film are formed; and firing the embedding material, wherein the forming of the oxidization barrier film includes: forming a first seed layer on the trench by supplying an aminosilane-based gas to the semiconductor substrate on which the trench is formed; and forming a silicon nitride film on the first seed layer, wherein the forming of the expandable film includes: forming a second seed layer on the silicon nitride film by supplying an aminosilane-based gas to the semiconductor substrate on which the silicon nitride film is formed; and forming a silicon film on the second seed layer.

According to another aspect of the present invention, a trench embedding method includes: forming an oxidization film on a trench by oxidizing the semiconductor substrate on which the trench is formed; nitriding the oxidization film; forming an expandable film on a nitrided oxidization film; embedding an embedding material that contracts by being fired on the trench where the oxidization film and the expandable film are formed; and firing the embedding material, wherein the forming of the expandable film includes: forming a seed layer on the nitrided oxidization film by supplying an aminosilane-based gas to the semiconductor substrate on which the nitrided oxidization film is formed; and forming a silicon film on the seed layer.

According to another aspect of the present invention, a film-forming apparatus includes: a process chamber which accommodates a semiconductor substrate on which a trench is formed; a gas supply mechanism which supplies an aminosilane-based gas, a silane-based gas, and a gas including a nitriding agent into the process chamber; a heating device which heats an inside of the process chamber; an exhauster which evacuates the inside of the process chamber; and a controller which controls the gas supply mechanism, the heating device, and the exhauster, wherein the controller controls the gas supply mechanism, the heating device, and the exhauster to perform the trench embedding method according to aspects of the present invention on the semiconductor substrate in the process chamber.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a flowchart showing a sequence of a trench embedding method according to an embodiment of the present invention;

FIG. 3 is a view showing a relationship between a deposition time and a film thickness of a silicon film;

Figure 2A:
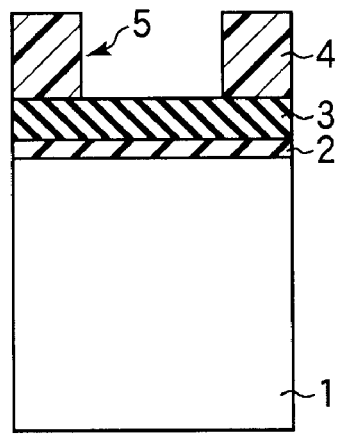
FIGS. 2A through 2I are cross-sectional views schematically showing states of a semiconductor substrate during the sequence shown in FIG. 1.

DETAILED DESCRIPTION OF THE INVENTION (Embodiments for Carrying Out the Invention)

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

(Embedding Method)

FIG. 1 is a flowchart showing a sequence of a trench embedding method according to an embodiment of the present invention. FIGS. 2A through 2I are cross-sectional views schematically showing states of a semiconductor substrate during the sequence shown in FIG. 1.

First, as shown in process 1 of FIG. 1, a trench is formed on the semiconductor substrate.

An example of forming the trench on the semiconductor substrate is as follows.

As shown in FIG. 2A, a surface of the semiconductor substrate, that is, a silicon substrate 1 in the present embodiment, is thermally oxidized to form a pad oxidization film 2. Then, silicon nitride is deposited on the pad oxidization film 2 to form a silicon nitride film 3. Then, a photoresist is coated on the silicon nitride film 3 to form a photoresist film 4. Then, a window 5 corresponding to a trench forming pattern is formed on the photoresist film 4 by using a photolithography method.

Figure 2B:
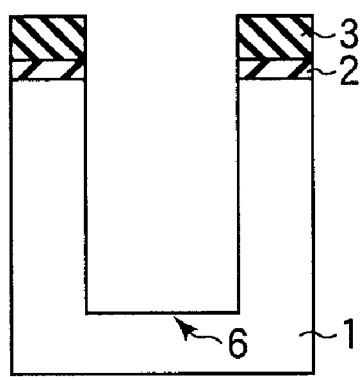

Next, as shown in FIG. 2B, anisotropic etching, for example, reactive ion etching, is performed on the silicon nitride film 3, the pad oxidization film 2, and the silicon substrate 1 by using the photoresist film 4 as a mask, thereby forming a trench 6 on the silicon substrate 1.

Next, as shown in process 2 of FIG. 1, an oxidization film is formed on a surface of the semiconductor substrate.

Figure 2C:
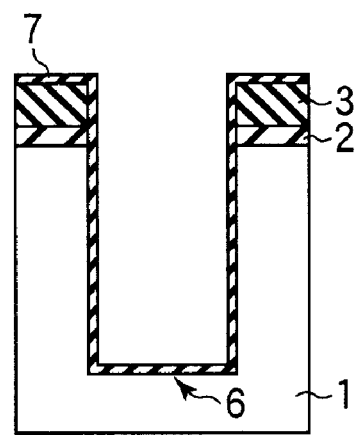
Figure 2D:
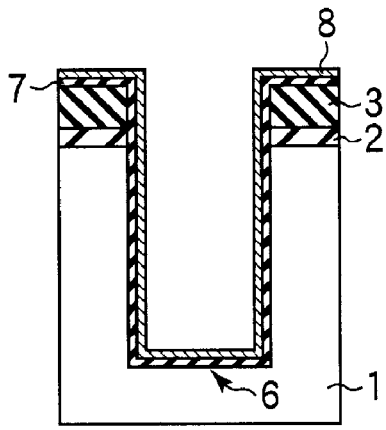

This process is, as shown in FIG. 2C, a process of forming a film that may be hardly oxidized compared to the silicon substrate 1 on a surface of the silicon substrate 1 exposed by at least a side wall of the trench 6. In the present embodiment, an oxidization film 7 is formed on at least the side wall of the trench 6. On the side wall of the trench 6, the oxidization film 7 is silicon oxide. Silicon oxide is hardly oxidized compared to silicon.

Also, in the present embodiment, the oxidization film 7 is formed by radical oxidization. According to radical oxidization, as shown in FIG. 2C, the pad oxidization film 2, the silicon nitride film 3, or the like may also be oxidized as well as the surface of the silicon substrate 1 exposed by the side wall of the trench 6. That is, an entire surface of the silicon substrate 1 on which the trench 6 is formed may be oxidized, and thus the oxidization film 7 is formed on the entire surface of the silicon substrate 1 on which the trench 6 is formed. If the oxidization film 7 is formed on the entire surface of the silicon substrate 1 on which the trench 6 is formed, a seed layer to be formed next may be formed on the oxidization film 7. If the seed layer is formed on both a nitride film and the oxidization film at the same time, there is a possibility that a growing speed of a silicon film to be formed after the seed layer may vary on the nitride film and on the oxidization film.

In this regard, as described in the present embodiment, if the seed layer is formed on the oxidization film 7, a difference in growing speeds of the silicon film may be reduced, thereby contributing to improvement of step coverage. Also, even if plasma oxidization is used instead of radical oxidization, the same effect as the radical oxidization may be obtained.

Next, as shown in process 3 of FIG. 1, an oxidization barrier film is formed on the oxidization film 7.

In the present embodiment, the oxidization barrier film is formed in two processes. First, as shown in process 31 of FIG. 1 and in FIG. 2D, a seed layer 8 is formed on the oxidization film 7. In detail, the silicon substrate 1 on which the oxidization film 7 is formed is heated, and an aminosilane-based gas is supplied to a surface of the silicon substrate 1 which is heated to form the seed layer 8 on the surface of the silicon substrate 1, that is, a surface of the oxidization film 7 in the present embodiment.

Examples of the aminosilane-based gas may include BAS (butylaminosilane), BTBAS (bis(tertiarybutylamino)silane), DMAS (dimethylaminosilane), BDMAS (bis(dimethylamino)silane), TDMAS (tri(dimethylamino)silane), DEAS (diethylaminosilane), BDEAS (bis(diethylamino)silane), DPAS (dipropylaminosilane), DIPAS (diisopropylaminosilane), or the like. In the present embodiment, DIPAS is used.

Process conditions in process 31 are as follows:
DIPAS flow rate: 150 sccm,
process time: 0.5 min,
process temperature: 450° C., and
process pressure: 532 Pa (4 Torr). The process 31 is a process hereinafter referred to as a pre-flow.

Process 31 is a process for enabling silicon nitride to be easily adsorbed to the oxidization film 7. Also, although the seed layer 8 is formed in process 31, a film is rarely actually formed. It is preferable that a thickness of the seed layer 8 be about a thickness of a monoatomic layer level. Specifically, the thickness of the seed layer 8 is equal to or greater than 0.1 nm and equal to or less than 0.3 nm.

Figure 2E:
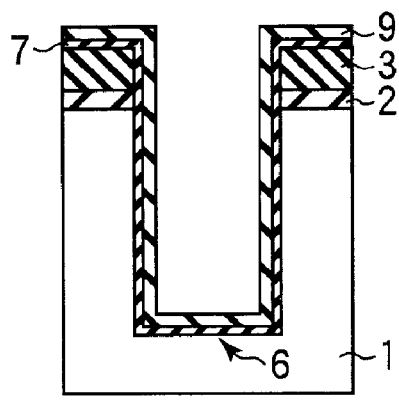

Next, as shown in process 32 of FIG. 1 and in FIG. 2E, a silicon nitride film 9 is formed on the seed layer 8. In detail, the silicon substrate 1 on which the seed layer 8 is formed is heated, and a gas including silicon and a gas including a nitriding agent are supplied to a surface of the silicon substrate 1 which is heated to form the silicon nitride film 9 on the seed layer 8. In the present embodiment, a silane-based gas, for example, dichlorosilane (DCS: $SiH_2Cl_2$), is used as the gas including silicon, and a gas including ammonia is used as the gas including a nitriding agent. Also, in the present embodiment, in order to form the silicon nitride film 9, technique called an ALD (atomic layer deposition) method or an MLD (molecular layer deposition) method that forms a film by alternately supplying a gas including silicon and a gas including a nitriding agent for nitriding silicon is used.

Process conditions in process 32 are as follows:
dichlorosilane flow rate: 1000 sccm,
ammonia flow rate: 5000 sccm,
process temperature: 630° C., and
process pressure: 51 Pa (0.386 Torr).

Under the above-described conditions, when the number of ALD cycles is about 30 cycles, the silicon nitride film 9 having a thin thickness of about 2 nm is formed.

Next, as shown in process 4 of FIG. 1, an expandable film is formed on an oxidization barrier film.

In the present embodiment, the expandable film is formed in two processes.

Figure 2F:
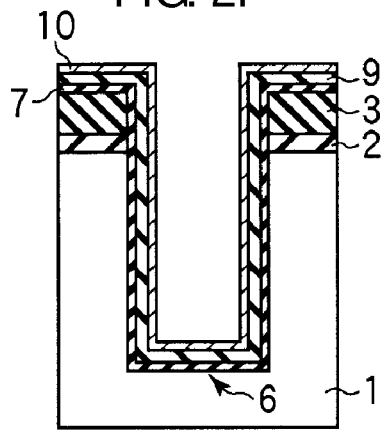

First, as shown in process 41 of FIG. 1 and in FIG. 2F, a seed layer 10 is formed on the silicon nitride film 9. In detail, the silicon substrate 1 on which the silicon nitride film 9 is formed is heated, and then an aminosilane-based gas is supplied to a surface of the silicon substrate 1 which is heated to form the seed layer 10 on the surface of the silicon substrate 1, that is, on a surface of the silicon nitride film 9 in the present embodiment.

Examples of the aminosilane-based gas may be the same as those of the seed layer 8. In the present embodiment, DIPAS is used.

Process conditions in process 41 are as follows:
DIPAS flow rate: 500 sccm,
process time: 0.5 min,
process temperature: 400° C., and
process pressure: 53 Pa (0.4 Torr).

It is preferable that a thickness of the seed layer 10 be about a thickness of an monoatomic layer level, similar to the seed layer 8. Specifically, the thickness of the seed layer 10 is equal to or greater than 0.1 nm and equal to or less than 0.3 nm.

Figure 2G:
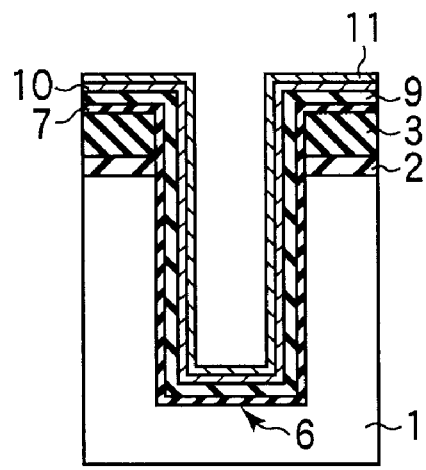

Next, as shown in process 42 of FIG. 1 and in FIG. 2G, a silicon film 11 is formed on the seed layer 10. In detail, the silicon substrate 1 on which the seed layer 10 is formed is heated, and then a silane-based gas not including an amino group, for example, a monosilane gas, is supplied to a surface of the silicon substrate 1 which is heated to form the silicon film 11 on the surface of the silicon substrate 1, that is, on a surface of the seed layer 10 in the present embodiment.

Process conditions in process 42 are as follows:
monosilane flow rate: 800 sccm,
process time: 4 min,
process temperature: 535° C., and
process pressure: 60 Pa (0.45 Torr).

Under the above-described conditions, the silicon film 11, which is amorphous, is formed to have a thin thickness in a range of about 3 to about 9 nm within a process time (deposition time) in a range of about 3 to about 5 min. A thickness of the silicon film 11 plays an important role in offsetting contraction of an embedding material to be formed later. Of course, an offset amount may be determined according to a sum of the minute thickness of the seed layer 10 and the thickness of the silicon film 11, but the seed layer 10 is a layer for catalyzing adsorption of monosilane and has a negligible thickness. Accordingly, a thickness of the silicon film 11 after being expanded may make up most of the offset amount. That is, the offset amount is substantially determined according to the thickness of the silicon film 11.

Also, in the present embodiment, monosilane is used as a raw material of the silicon film 11.

Also, if a high-order silane having an order higher than monosilane, for example, disilane ($Si_2H_6$), is supplied to previously form a silicon layer on the surface of the seed layer 10 before supplying monosilane, step coverage of the silicon film 11 may be improved compared to a case where monosilane is directly supplied to the seed layer 10. However, if the silicon layer formed by the high-order silane is excessively thick, the step coverage of the silicon film 11 may be degraded, and thus the silicon layer may be formed thin. For example, a film thickness of the silicon layer formed by the high-order silane, which does not degrade the step coverage, exceeds 0 nm and is equal to or less than 0.5 nm. Also, process conditions when the thin silicon layer is formed by the high-order silane are as follows:
disilane flow rate: 200 sccm,
process time: 3 min,
process temperature: 400° C., and
process pressure: 133 Pa (1 Torr).

If the step coverage of the silicon film 11 may be improved, a film thickness of the silicon film 11 formed on the side wall of the trench 6 may be almost the same as a film thickness of the silicon film 11 formed on an upper surface of the silicon substrate 1. Accordingly, when the silicon film 11 formed on the side wall of the trench 6 is completely oxidized, the silicon film 11 formed on the upper surface of the silicon substrate 1 may be completely oxidized, and thus the silicon film 11 no longer remains.

However, in an embodiment of the present invention, a raw material other than monosilane may be selected because the oxidization barrier film, that is, the silicon nitride film 9 in the present embodiment, exists on the trench 6. Accordingly, although the film thickness of the silicon film 11 formed on the side wall of the trench 6 is different from the film thickness of the silicon film 11 formed on the upper surface of the silicon substrate 1, even when the silicon film 11 is oxidized under a condition where the thicker of the film thicknesses of the silicon film 11 is completely oxidized, oxidization may be prevented from reaching the silicon substrate 1.

Accordingly, the following raw materials may be used as the raw material of the silicon film 11.

Examples of a silane-based gas not including an amino group may be a gas including at least one of:
$SiH_2$,
$SiH_4$,
$SiH_6$,
$Si_2H_4$,
$Si_2H_6$,
a silicon hydride that may be expressed as $Si_mH_{2m+2}$ (here, m is a natural number equal to or greater than 3), and
a silicon hydride that may be expressed as $Si_nH_{2n}$ (here, n is a natural number equal to or greater than 3).

Also, when the silicon film 11 is formed using a low-order silane-based gas not including an amino group such as monosilane ($SiH_4$) in one or two processes, it is preferable that a higher-order silane-based gas not including an amino group, for example, disilane ($Si_2H_6$), be previously supplied before supplying the low-order silane-based gas not including an amino group, as described above.

As such, according to a method of supplying a low-order silane-based gas not including an amino group after supplying a higher-order silane-based gas not including an amino group, the step coverage of the silicon film 11 may be improved as described above, and also an incubation time of the silicon film 11 may be reduced.

Figure 2H:
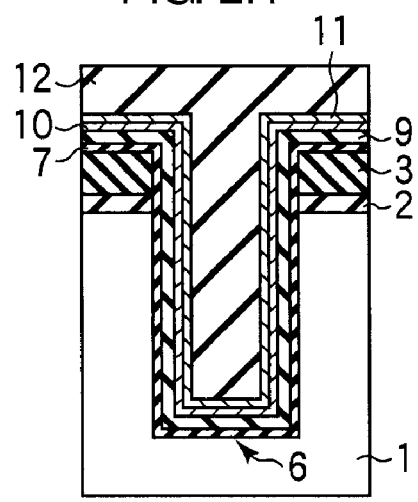

Next, as shown in process 5 of FIG. 1 and in FIG. 2H, the trench 6 is embedded by using an embedding material 12 that contracts by being fired. For example, the trench 6 is embedded by spin coating the embedding material 12 in a liquid phase, which is changed into silicon oxide by being fired, on a surface of the silicon substrate 1 on which the silicon film 11 is formed.

An example of a material that changes into silicon oxide by being fired may include an inorganic polymer mainly including PHPS (perhydropolysilazane: $SiH_2NH$).

Figure 2I:
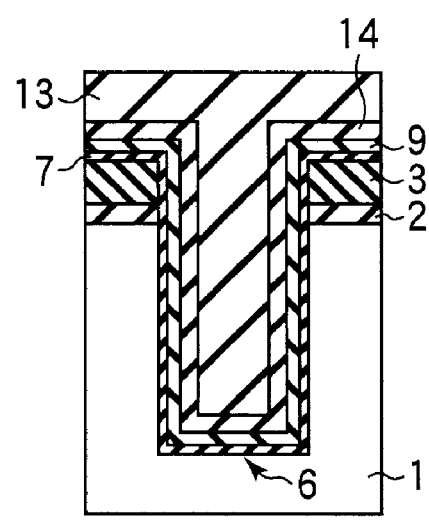

Finally, as shown in process 6 of FIG. 1 and in FIG. 2I, the embedding material 12 is fired in an atmosphere including water and/or a hydroxyl group to be changed into a silicon oxide 13 and to change the silicon film 11 and the seed layer 10 into a silicon oxide 14. In detail, the silicon substrate 1 coated with the embedding material 12 is fired in an atmosphere including water and/or a hydroxyl group to change the embedding material 12 into the silicon oxide 13 and to change the silicon film 11 and the seed layer 10 into the silicon oxide 14.

Process conditions in process 6 are as follows:
$H_2O$ flow rate: 10 L/min,
process time: 45 min,
process temperature: 750° C., and
process pressure: 53200 Pa (400 Torr).

In process 6, the oxidization barrier film, that is, the silicon nitride film 9 in the present embodiment, serves as an oxidization barrier to the silicon substrate 1. Accordingly, although process 6 is performed, oxidization to the silicon substrate 1 does not occur. When the trench 6 is used in a device isolation area in a semiconductor integrated circuit device, for example, used in a shallow trench isolation, oxidization to the silicon substrate 1 does not occur, and thus a device active area where an active element such as a transistor is formed may be prevented from being reduced due to oxidization.

When the embedding material 12 is fired to be changed into the silicon oxide 13, the embedding material 12 contracts. On the contrary, the silicon film 11 and the seed layer 10 expand when being changed into the silicon oxide 14. As such, the contraction of the embedding material 12 is offset by the expansion of the silicon film 11 and the seed layer 10, thereby preventing a gap from being generated on the trench 6.

(Incubation Time)

A problem of a long incubation time of monosilane has been resolved by pre-flowing an aminosilane-based gas to a surface of the silicon substrate 1, that is, a surface of the silicon nitride film 9 in the present embodiment, to form the seed layer 10, and then forming the silicon film 11.

FIG. 3 is a view showing a relationship between a deposition time and a film thickness of the silicon film 11. A result shown in FIG. 3 is obtained when a base is a silicon nitride film (SiN). In the present embodiment, the silicon nitride film corresponds to the silicon nitride film 9.

Process conditions in the pre-flow process used in the present embodiment are as follows:
  DIPAS flow rate: 500 sccm,
  process time: 5 min
  process temperature: 400° C., and
  process pressure: 53.2 Pa (0.4 Torr).

Process conditions in the process for forming the silicon film 11 used in the present embodiment are as follows:
  monosilane flow rate: 500 sccm
  deposition time: 30 min/45 min/60 min
  process temperature: 500° C.
  process pressure: 53.2 Pa (0.4 Torr).

The film thickness of the silicon film 11 was measured at three points when the deposition time was 30 min, 45 min, and 60 min.

Figure 4:
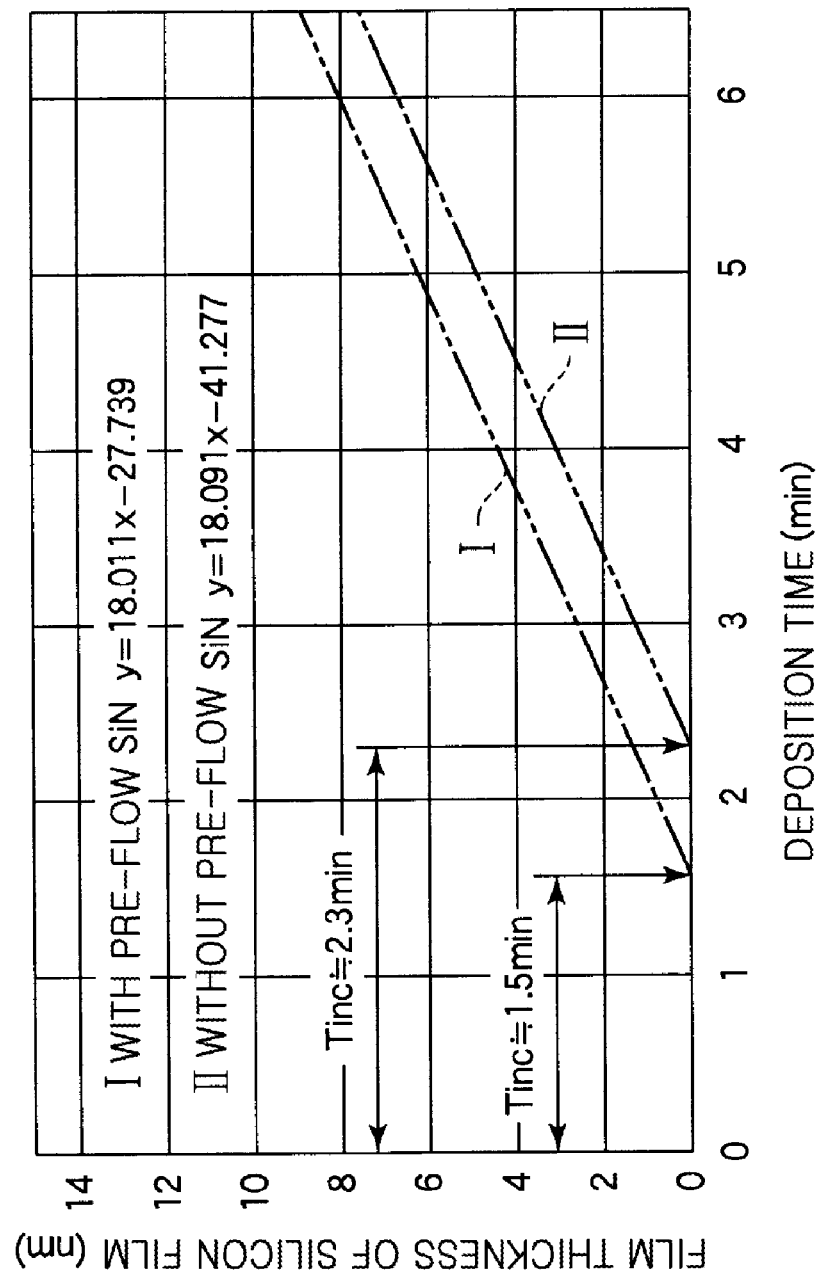
FIG. 4 is an enlarged view of the portion A of FIG. 3 indicated by the broken line.

Line I and line II shown in FIGS. 3 and 4 show a result obtained in a case where the pre-flow process is performed and a result obtained in a case where the pre-flow process is not performed, respectively. The line I and the line II are straight lines obtained by straight-line approximating the three measured film thicknesses by using a least-squares method. Formulas thereof are as follows:

$$\text{Line I: } y=18.011x-27.739 \quad (1), \text{ and}$$

$$\text{Line II: } y=18.091x-41.277 \quad (2).$$

As shown in FIG. 3, in the case where the pre-flow process is performed, the film thickness of the silicon film 11 is much more increased, compared to the case where the pre-flow process is not performed.

In the above-described formulas (1) and (2), when y is 0, that is, when the film thickness of the silicon film 11 is "0", intersection points between the lines I and II and deposition time are measured, and a result of the measuring is shown in FIG. 4. Also, FIG. 4 is an enlarged view of the portion A of FIG. 3 indicated by the broken line.

As shown in FIG. 4, in a case where the pre-flow process is performed, when a base is a silicon nitride film, deposition of the silicon film 11 begins about 1.5 min (x≈1.540) after the process begins. On the other hand, in a case where the pre-flow process is not performed, when a base is a silicon nitride film, deposition of the silicon film 11 begins about 2.3 min (x≈2.282) after the process begins.

As such, the pre-flow process with the aminosilane-based gas may be performed to the silicon nitride film 9 so as to reduce the incubation time from about 2.3 min to about 1.5 min. Accordingly, the silicon film 11 obtained may be thin.

Also, a problem of a long incubation time of the silicon nitride film 9 has been resolved by pre-flowing an aminosilane-based gas to a surface of the silicon substrate 1, that is, a surface of the silicon nitride film 9 in the present embodiment, to form the seed layer 10, and then forming the silicon film 11.

Figure 5:
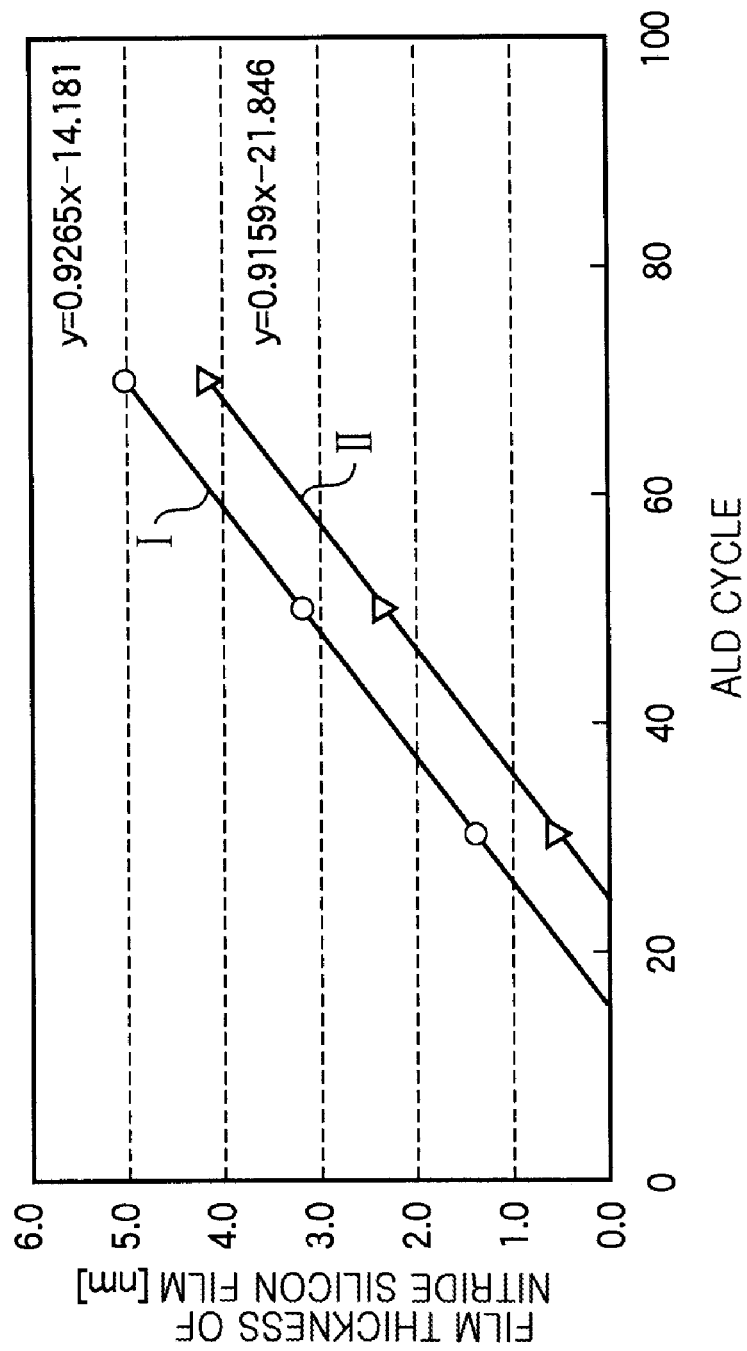
FIG. 5 is a view showing a relationship between an ALD cycle and a film thickness of a silicon nitride film.

FIG. 5 is a view showing a relationship between an ALD cycle and a film thickness of the silicon nitride film 9. A result shown in FIG. 5 is obtained when a base is an oxide silicon film (SiO$_2$). In the present embodiment, the oxide silicon film corresponds to the oxidization film 7.

Process conditions in the pre-flow process used in the present embodiment are as follows:
  DIPAS flow rate: 150 sccm,
  process time: 0.5 min,
  process temperature: 450° C., and
  process pressure: 532 Pa (4 Torr).

Process conditions in the process for forming the silicon nitride film 9 used in the present embodiment are as follows:
  dichlorosilane flow rate: 1000 sccm,
  ammonia flow rate: 5000 sccm,
  process temperature: 630° C., and
  process pressure: 51 Pa (0.386 Torr).

The film thickness of the silicon nitride film 9 was measured when the ALD cycle was 30 cycles, 50 cycles, and 70 cycles.

Line I and line II shown in FIG. 5 show a result obtained in a case where the pre-flow process is performed and a result obtained in a case where the pre-flow process is not performed, respectively. The line I and the line II are straight lines obtained by straight-line approximating the three measured film thicknesses by using a least-squares method. Formulas thereof are as follows:

$$\text{Line I: } y=0.9265x-14.181 \quad (3), \text{ and}$$

$$\text{Line II: } y=0.9159x-21.846 \quad (4)$$

In the above-described formulas (3) and (4), when y is 0, that is, when the film thickness of the silicon nitride film is "0", the ALD cycles are as follows.
  Line I: 19 cycles
  Line II: 24 cycles (comparative example)

That is, by performing the pre-flow process on the base before forming the silicon nitride film 9, the number of cycles when the silicon nitride film 9 starts to grow may be shortened from 24 cycles, that is, the number of cycles when the pre-flow process is not performed on the base, to 19 cycles.

Thus, by performing the pre-flow process on the base, the incubation time of the silicon nitride film 9 may be shortened, compared to a case where the silicon nitride film 9 is directly formed on the oxidization film 7. Accordingly, the silicon nitride film 9 obtained may be thin.

According to the trench embedding method of an embodiment of the present invention, the incubation times of the oxidization barrier film (the silicon nitride film 9 in the present embodiment) formed on the trench 6 and of the expandable film (the silicon film 11 and the seed layer 10 in the present embodiment) may be shortened, respectively. Accordingly, since the oxidization barrier film and the expandable film may be formed thin, even if the trench 6 is further miniaturized, the trench embedding method allows the expandable film and a film serving as an oxidization barrier to be formed on the trench 6.

(Film-Forming Apparatus)

Next, a film-forming apparatus capable of performing the trench embedding method according to an embodiment of the present invention will be described hereinafter.

Figure 6:
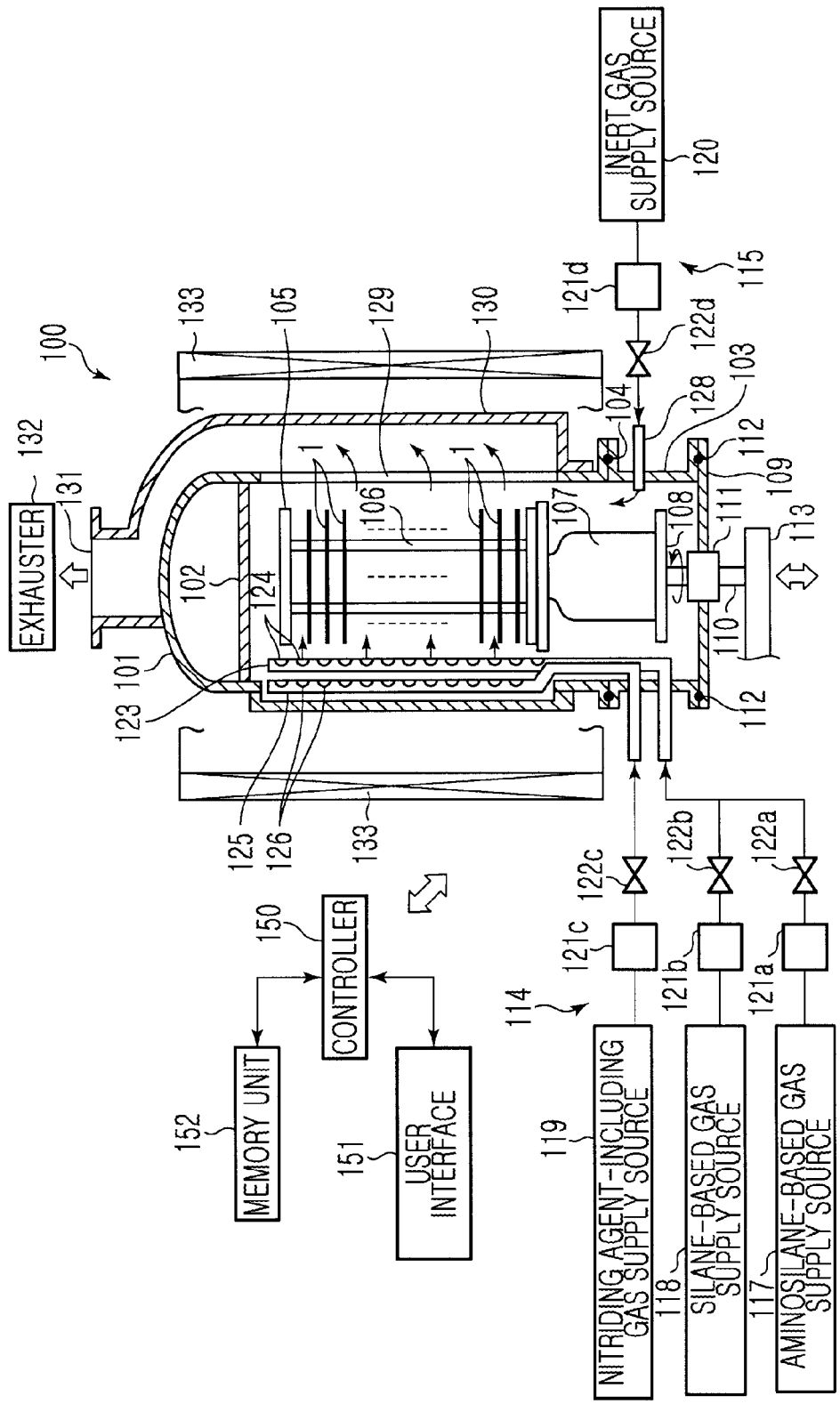
FIG. 6 is a cross-sectional view schematically showing an example of a film-forming apparatus capable of performing a trench embedding method according to an embodiment of the present invention.

FIG. 6 is a cross-sectional view schematically showing a film-forming apparatus 100 capable of performing the trench embedding method according to an embodiment of the present invention.

As shown in FIG. 6, the film-forming apparatus 100 includes a process chamber 101 having a shape of a bottom-open cylinder with a ceiling. The entire process chamber 101 is formed of quartz, for example. A quartz ceiling plate 102 is provided on the ceiling of the process chamber 101. A manifold 103, which is molded of a stainless steel, for example, and has a cylindrical shape, is connected to a bottom opening of the process chamber 101 via a sealing member 104, such as an O-ring.

The manifold 103 supports the bottom of the process chamber 101. A quartz wafer boat 105, on which a plurality of, for example, 50 to 100, semiconductor substrates (the silicon substrates 1 in the present embodiment) as objects to be processed can be held in multiple layers, may be inserted from below the manifold 103 into the process chamber 101. The wafer boat 105 has a plurality of pillars 106, so that a plurality of the silicon substrates 1 are supported by grooves formed on the pillars 106.

The wafer boat 105 is disposed on a table 108 via a quartz thermos vessel 107. The table 108 is supported by a rotation shaft 110, which penetrates, for example, a stainless steel cover unit 109 for opening and closing the bottom opening of the manifold 103. A magnetic fluid seal 111, for example, is provided on a portion of the rotation shaft 110 penetrating the cover unit 109 so as to tightly seal the rotation shaft 110 and to rotatably support the rotation shaft 110. A sealing member 112, e.g., an O-ring, is installed between the peripheral portion of the cover unit 109 and the bottom of the manifold 103. Accordingly, sealing of the process chamber 101 is held. The rotation shaft 110 is attached to the leading end of an arm 113 supported by an elevating mechanism (not shown), such as a boat elevator, or the like. Therefore, the wafer boat 105, the cover unit 109, and the like are elevated together and are inserted to and pulled out from the process chamber 101.

The film-forming apparatus 100 includes a process gas supply mechanism 114 supplying a gas used in a process into the process chamber 101, and an inert gas supply mechanism 115 supplying an inert gas into the process chamber 101.

The process gas supply mechanism 114 includes an aminosilane-based gas supply source 117, a silane-based gas supply source 118, and a nitriding agent-including gas supply source 119. An example of a nitriding agent-including gas is a gas including ammonia.

The inert gas supply mechanism 115 includes an inert gas supply source 120. An inert gas is used as a purge gas or the like. An example of the inert gas is a nitrogen ($N_2$) gas.

The aminosilane-based gas supply source 117 is connected to a distribution nozzle 123 through a flow rate controller 121*a* and an opening/closing valve 122*a*. The distribution nozzle 123, for example, a quartz pipe, inwardly passes through a side wall of the manifold 103, is bent upward, and vertically extends. A plurality of gas ejection holes 124 are provided at predetermined intervals in a vertical portion of the distribution nozzle 123. The aminosilane-based gas is substantially uniformly ejected into the process chamber 101 in a horizontal direction from the gas ejection holes 124.

Also, the silane-based gas supply source 118 is connected to, for example, the distribution nozzle 123, through a flow rate controller 121*b* and an opening/closing valve 122*b*.

The nitriding agent-including gas supply source 119 is connected to a distribution nozzle 125 through a flow rate controller 121*c* and an opening/closing valve 122*c*. The distribution nozzle 125, for example, a quartz pipe, inwardly passes through the side wall of the manifold 103, is bent upward, and vertically extends. A plurality of gas ejection holes 126 are provided at predetermined intervals in a vertical portion of the distribution nozzle 125. A gas including ammonia is substantially uniformly ejected into the process chamber 101 in a horizontal direction from the gas ejection holes 126.

The inert gas supply source 120 is connected to a nozzle 128 through a flow rate controller 121*d* and an opening/closing valve 122*d*. The nozzle 128 passes through the side wall of the manifold 103, and allows an inert gas to be ejected into the process chamber 101 in a horizontal direction from a leading end of the nozzle 128.

An exhaust port 129 for evacuating an inside of the process chamber 101 is provided at a portion of the process chamber 101 opposite to the distribution nozzles 123 and 125. The exhaust port 129 is longitudinally and narrowly provided by vertically cutting off a side wall of the process chamber 101. An exhaust port cover member 130 having a U-shaped cross-section and provided to cover the exhaust port 129 is attached by being welded to a portion of the process chamber 101 corresponding to the exhaust port 129. The exhaust port cover member 130 extends upward along the side wall of the process chamber 101 to define a gas outlet 131 at an upper side of the process chamber 101. An exhauster 132 including a vacuum pump or the like is connected to the gas outlet 131. The exhauster 132 exhausts a process gas used in a process from the process chamber 101, and makes a pressure in the process chamber 101 be a process pressure according to a process.

A heating device 133 having a cylindrical shape is provided around an outer circumference of the process chamber 101. The heating device 133 activates a gas supplied into the process chamber 101, and heats the object to be processed, that is, the silicon substrate 1 in the present embodiment, held in the process chamber 101 by heating the inside of the process chamber 101.

Each element of the film-forming apparatus 100 is controlled by a controller 150 including, for example, a microprocessor (computer). A user interface 151 including a keyboard for inputting a command in order for an operator to manage the film-forming apparatus 100, a display that visually displays an operation state of the film-forming apparatus 100, and so on is connected to the controller 150.

A memory unit 152 is connected to the controller 150. A control program for performing various processes performed in the film-forming apparatus 100 under the control of the controller 150, or a program, that is, a recipe, for performing a process in each element of the film-forming apparatus 100 according to process conditions is stored in the memory unit 152. The recipe is stored in, for example, a storage medium, of the memory unit 152. The storage medium may be a hard disk or a semiconductor memory, or a portable type such as a CD-ROM, a DVD, or a flash memory. Also, the recipe may be appropriately transmitted from another device via, for example, a dedicated line. If required, desired processes are performed by the film-forming apparatus 100 under the control of the controller 150 by invoking a recipe from the memory unit 152 according to instructions or the like from the user interface 151 and performing a process based on the recipe in the controller 150.

In the present embodiment, under the control of the controller 150, processes according to processes 31, 32, 41, and 42 of the trench embedding method are sequentially performed.

In the processes for forming the seed layer 8 in process 31 and the seed layer 10 in process 41, an aminosilane-based gas (for example, DIPAS) is supplied to the process chamber 101 from the aminosilane-based gas supply source 117. Also, in the process for forming the silicon nitride film 9 in process 32, a silane-based gas (for example, dichlorosilane) and a gas including a nitriding agent (for example, a gas including ammonia) are supplied to the process chamber 101 from the silane-based gas supply source 118 and the nitriding agent-including gas supply source 119, respectively. Also, in the process for forming the silicon film 11 in process 42, a silane-based gas (for example, monosilane) is supplied from the silane-based gas supply source 118.

The controller 150 controls the process gas supply mechanism 114, the exhauster 132, and the heating device 133 to perform the processes of processes 31, 32, 41, and 42.

Also, in order to form the silicon nitride film 9, an ALD (atomic layer deposition) method or an MLD (molecular layer deposition) method for forming a film by alternately supplying a gas including silicon (for example, a silane-based gas) and a gas including a nitriding agent may be used, or alternatively, a so-called CVD (chemical vapor deposition) method by simultaneously supplying a gas including silicon and a gas including a nitriding agent may be used.

The trench embedding method according to the embodiment of the present invention may be performed by the film-forming apparatus 100 of FIG. 6.

Although the present invention has been explained with reference to the embodiments, the present invention is not limited to the embodiments, and various modifications may be made. Also, the embodiments of the present invention are not unique embodiments.

For example, in the embodiment of the present invention, although the silicon nitride film 9 is formed as the oxidization barrier film, the oxidization film 7 may be nitrided. Examples of a nitriding process of the oxidization film 7 may include a plasma nitriding process, a process of changing the oxidization film 7 into an SiON film by FNC nitriding (NO, $N_2O$, $NH_3$) or the like.

Also, although a thermal ALD method or a thermal MLD method is used to form the silicon nitride film 9 in the above-described embodiment, a plasma ALD method or a plasma MLD method may also be used to form the silicon nitride film 9.

Process conditions when a plasma ALD method or a plasma MLD method is used to form the silicon nitride film 9 are as follows:
dichlorosilane flow rate: 1000 sccm,
ammonia flow rate: 5000 sccm,
process temperature: 630° C.,
process pressure: 51 Pa (0.386 Torr), and
RF power: 100 W.

The above-described process conditions are applicable to the process conditions in process 32 of FIG. 1.

Also, in the above-described embodiment, since an oxidization barrier film is formed or an oxidization film is nitrided, freedom in choosing a raw material of the silicon film 11 may be obtained. Examples of a silane-based gas not including an amino-group have been described as the raw material of the silicon film 11. The examples may include a silicon hydride expressed as $Si_mH_{2m+2}$ (here, m is a natural number equal to or greater than 3) and a silicon hydride expressed as $Si_nH_{2n}$ (here, n is a natural number equal to or greater than 3).

The silicon hydride expressed as $Si_mH_{2m+2}$ (here, m is a natural number equal to or greater than 3) may be at least one of:
trisilane ($Si_3H_8$),
tetrasilane ($Si_4H_{10}$),
pentasilane ($Si_5H_{12}$),
hexasilane ($Si_6H_{14}$), and
heptasilane ($Si_7H_{16}$).

Furthermore, the silicon hydride expressed as $Si_nH_{2n}$ (here, n is a natural number equal to or greater than 3) is at least one of:
cyclotrisilane ($Si_3H_6$),
cyclotetrasilane ($Si_4H_8$),
cyclopentasilane ($Si_5H_{10}$),
cyclohexasilane ($Si_6H_{12}$), and
cycloheptasilane ($Si_7H_{14}$).

Also, in the above-described embodiment, spin coating glass, for example, PHPS, is used as the embedding material 12, which contracts by being fired. However, the embedding material 12 is not limited to the spin coating glass, and a CVD-based embedding material that contracts by being fired may also be used. Examples of the CVD-based embedding material may include a $SiO_2$ film formed by using a HDP (high-density plasma), an $SiO_2$ film formed by using an $SiH_4$-based gas and hydrogen peroxide ($H_2O_2$), and the like.

Also, various other modifications may be made in the present invention without departing from the scope of the invention.

The present invention may provide a trench embedding method that allows an expandable film and a film serving as an oxidization barrier to be formed on a trench even if the trench is further miniaturized, and a film-forming apparatus capable of performing the trench embedding method.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A trench embedding method comprising:
   forming an oxidization film on a trench formed on a semiconductor substrate by oxidizing the semiconductor substrate on which the trench is formed;
   forming an oxidization barrier film on the oxidization film;
   forming an expandable film on the oxidization barrier film;
   embedding an embedding material that contracts by being fired on the trench where the oxidization barrier film and the expandable film are formed; and
   firing the embedding material,
   wherein the forming of the oxidization barrier film comprises:
      forming a first seed layer on the oxidization film by supplying an aminosilane-based gas to the semiconductor substrate on which the oxidization film is formed; and
      forming a silicon nitride film on the first seed layer,
   wherein the forming of the expandable film comprises:
      forming a second seed layer on the silicon nitride film by supplying an aminosilane-based gas to the semiconductor substrate on which the silicon nitride film is formed; and
      forming a silicon film on the second seed layer.

2. The trench embedding method of claim 1, wherein radical oxidization or plasma oxidization is used in the forming of the oxidization film.

3. The trench embedding method of claim 1, wherein the aminosilane-based gas is selected from among gases including at least one of:
BAS (butylaminosilane);
BTBAS (bis(tertiarybutylamino)silane);
DMAS (dimethylaminosilane);
BDMAS (bis(dimethylamino)silane);
TDMAS (tri(dimethylamino)silane);
DEAS (diethylaminosilane);
BDEAS (bis(diethylamino)silane);
DPAS (dipropylaminosilane); and
DIPAS (diisopropylaminosilane).

4. The trench embedding method of claim 1, wherein a silane-based gas not including an amino-group is used in the forming of the silicon film.

5. The trench embedding method of claim 4, wherein the silicon film is formed by supplying a high-order silane-based gas not including an amino group and then supplying a silane-based gas not including an amino group that is lower than the high-order silane-based gas not including an amino group.

6. The trench embedding method of claim 5, wherein a film thickness of the silicon layer formed of the high-order silane-based gas not including an amino group exceeds 0 nm and is equal to or less than 0.5 nm.

7. The trench embedding method of claim 4, wherein the silane-based gas not including an amino group is selected from among gases including at least one of:
$SiH_2$;
$SiH_4$;
$SiH_6$;
$Si_2H_4$;
$Si_2H_6$;
a silicon hydride expressed as $Si_mH_{2m+}$, where m is a natural number equal to or greater than 3; and
a silicon hydride expressed as $Si_nH_{2n}$, where n is a natural number equal to or greater than 3.

8. The trench embedding method of claim 7, wherein the silicon hydride expressed as $Si_mH_{2m+2}$ is selected from at least one of:
trisilane ($Si_3H_8$);
tetrasilane ($Si_4H_{10}$);
pentasilane ($Si_5H_{12}$);
hexasilane ($Si_6H_{14}$); and
heptasilane ($Si_7H_{16}$) and
the silicon hydride expressed as $Si_nH_{2n}$ is selected from at least one of:
cyclotrisilane ($Si_3H_6$);
cyclotetrasilane ($Si_4H_8$);
cyclopentasilane ($Si_5H_{10}$);
cyclohexasilane ($Si_6H_{12}$); and
cycloheptasilane ($Si_7H_{14}$).

9. The trench embedding method of claim 1, wherein the trench embedding method is used in a process for manufacturing a semiconductor device.

10. The trench embedding method of claim 9, wherein the trench is used in a device isolation area provided in the semiconductor device.

* * * * *